(12) United States Patent
Cook

(10) Patent No.: US 10,006,948 B2
(45) Date of Patent: Jun. 26, 2018

(54) CURRENT METER WITH VOLTAGE AWARENESS

(75) Inventor: Martin Cook, Tigard, OR (US)

(73) Assignee: Veris Industries, LLC, Tualatin, OR (US)

( * ) Notice: Subject to any disclaimer, the term of this patent is extended or adjusted under 35 U.S.C. 154(b) by 720 days.

(21) Appl. No.: 13/349,088

(22) Filed: Jan. 12, 2012

(65) Prior Publication Data

US 2012/0217954 A1 Aug. 30, 2012

Related U.S. Application Data

(60) Provisional application No. 61/446,899, filed on Feb. 25, 2011.

(51) Int. Cl.
| | |
|---|---|
| *G01R 1/30* | (2006.01) |
| *G01R 17/16* | (2006.01) |
| *G01R 19/00* | (2006.01) |
| *G01R 19/25* | (2006.01) |
| G01R 1/02 | (2006.01) |
| G01R 15/18 | (2006.01) |
| G01R 21/133 | (2006.01) |

(52) U.S. Cl.
CPC ......... *G01R 19/2513* (2013.01); *G01R 1/025* (2013.01); *G01R 15/183* (2013.01); *G01R 21/133* (2013.01)

(58) Field of Classification Search
CPC ...... G01R 21/06; G01R 19/00; G01R 15/181; G01R 31/40
USPC .......... 324/123, 76.11, 107, 127; 702/60, 64
See application file for complete search history.

(56) References Cited

U.S. PATENT DOCUMENTS

| | | | |
|---|---|---|---|
| 1,100,171 | A | 6/1914 | Brown |
| 1,455,263 | A | 5/1923 | Oberfell |
| 1,569,723 | A | 1/1926 | Dickinson |
| 1,800,474 | A | 4/1931 | Scherer |
| 1,830,541 | A | 11/1931 | Harris |
| 1,871,710 | A | 8/1932 | Lenehan |
| 2,059,594 | A | 11/1936 | Massa, Jr. |
| 2,411,405 | A | 11/1946 | Yuhas |
| 2,412,782 | A | 12/1946 | Palmer |
| 2,428,613 | A | 10/1947 | Boyajian |
| 2,428,784 | A | 10/1947 | Cole |
| 2,512,070 | A | 6/1950 | Nelson et al. |
| 2,663,190 | A | 12/1953 | Ilgenfritz |
| 2,746,295 | A | 5/1956 | Lubkin |
| 2,802,182 | A | 8/1957 | Godshalk et al. |

(Continued)

FOREIGN PATENT DOCUMENTS

| | | |
|---|---|---|
| EP | 1531334 A2 | 5/2005 |
| JP | 5083776 | 4/1993 |

OTHER PUBLICATIONS

Chaniotakis et al., Operational Amplifier Circuits, 6.071, 2006, p. 1-26, http://ocw.mit.edu/course/electrical-engineering-and-computer-science/6-071j-introduction-to-electronics-signals-and-measurements-spring-2006/lecture-notes/23_op_amps2.pdf.*

(Continued)

*Primary Examiner* — Giovanni Astacio-Oquendo
(74) *Attorney, Agent, or Firm* — Chernoff Vilhauer LLP

(57) ABSTRACT

The flexibility of a branch circuit monitor is improved by a signal conditioning unit that outputs a voltage in response to an input voltage and which is configurable to output the same range of output voltages in response to input voltages varying over different ranges.

9 Claims, 10 Drawing Sheets

(56) References Cited

U.S. PATENT DOCUMENTS

| | | |
|---|---|---|
| 2,852,739 A | 9/1958 | Hansen |
| 2,943,488 A | 7/1960 | Strobel et al. |
| 3,190,122 A | 6/1965 | Edwards |
| 3,243,674 A | 3/1966 | Ebert |
| 3,287,974 A | 11/1966 | Ciemochowski |
| 3,374,434 A | 3/1968 | Perry |
| 3,493,760 A | 2/1970 | Hoadley |
| 3,512,045 A | 5/1970 | Sanger et al. |
| 3,584,294 A | 6/1971 | Siwko |
| 3,593,078 A | 7/1971 | Dornshy et al. |
| 3,696,288 A | 10/1972 | Carman |
| 3,728,705 A | 4/1973 | Atkins |
| 3,769,548 A | 10/1973 | Pardue |
| 3,772,625 A | 11/1973 | Raupach |
| 3,861,411 A | 1/1975 | Mitchell et al. |
| 3,955,701 A | 5/1976 | Fisch |
| 3,976,924 A | 8/1976 | Vanjani |
| 4,001,647 A | 1/1977 | Klein et al. |
| 4,001,758 A | 1/1977 | Esper et al. |
| 4,007,401 A | 1/1977 | Kimmel et al. |
| 4,030,058 A | 6/1977 | Riffe et al. |
| 4,048,605 A | 9/1977 | McCollum |
| 4,096,436 A | 6/1978 | Cook et al. |
| 4,107,519 A | 8/1978 | Bicek |
| D249,883 S | 10/1978 | Collins |
| 4,124,030 A | 11/1978 | Roberts |
| 4,151,578 A | 4/1979 | Bell |
| 4,158,217 A | 6/1979 | Bell |
| 4,158,810 A | 6/1979 | Leskovar |
| 4,177,496 A | 12/1979 | Bell et al. |
| 4,189,751 A * | 2/1980 | Nagumo .......... H04N 9/045 348/246 |
| 4,198,595 A | 4/1980 | Milkovic |
| 4,207,604 A | 6/1980 | Bell |
| 4,215,278 A | 7/1980 | Barbier et al. |
| 4,227,419 A | 10/1980 | Park |
| 4,241,237 A | 12/1980 | Paraskevakos et al. |
| 4,249,264 A | 2/1981 | Crochet et al. |
| 4,250,449 A | 2/1981 | Shum |
| 4,253,336 A | 3/1981 | Pietzuch |
| 4,258,348 A | 3/1981 | Belfer et al. |
| 4,268,823 A * | 5/1981 | Rauchut et al. .......... 340/570 |
| 4,297,741 A | 10/1981 | Howell |
| 4,328,903 A | 5/1982 | Baars |
| 4,354,155 A | 10/1982 | Speidel et al. |
| 4,359,672 A | 11/1982 | Hart |
| 4,362,580 A | 12/1982 | Kane et al. |
| 4,363,061 A | 12/1982 | Vaerewyck et al. |
| 4,371,814 A | 2/1983 | Hannas |
| 4,373,392 A | 2/1983 | Nagamoto |
| 4,384,289 A | 5/1983 | Stillwell et al. |
| 4,386,280 A | 5/1983 | Ricaud et al. |
| 4,388,668 A | 6/1983 | Bell et al. |
| 4,393,714 A | 7/1983 | Schmidt |
| 4,398,426 A | 8/1983 | Park et al. |
| 4,408,175 A | 10/1983 | Nelson et al. |
| 4,413,193 A | 11/1983 | Crockett |
| 4,413,230 A | 11/1983 | Miller |
| 4,426,673 A | 1/1984 | Bell et al. |
| 4,432,238 A | 2/1984 | Tward |
| 4,463,431 A * | 7/1984 | Schumaker .......... G01R 29/027 327/348 |
| 4,491,790 A | 1/1985 | Miller |
| 4,492,919 A | 1/1985 | Mikovic |
| 4,495,463 A | 1/1985 | Milkovic |
| 4,506,199 A | 3/1985 | Asche |
| 4,558,310 A | 12/1985 | McAllise |
| 4,558,595 A | 12/1985 | Kompelien |
| 4,574,266 A | 3/1986 | Valentine |
| 4,605,883 A | 8/1986 | Cockroft |
| 4,621,532 A | 11/1986 | Takagi et al. |
| 4,660,407 A | 4/1987 | Takami et al. |
| 4,709,339 A | 11/1987 | Fernandes |
| 4,739,229 A | 4/1988 | Heiler, Jr. |
| 4,746,809 A | 5/1988 | Coleman et al. |
| 4,754,365 A | 6/1988 | Kazahaya |
| 4,757,416 A | 7/1988 | Wilkerson |
| 4,758,774 A | 7/1988 | Crawford et al. |
| 4,758,962 A | 7/1988 | Fernandes |
| 4,783,748 A | 11/1988 | Swarztrauber et al. |
| 4,794,327 A | 12/1988 | Fernandes |
| 4,808,910 A | 2/1989 | Kessi |
| D301,331 S | 5/1989 | Rhodin |
| 4,851,803 A | 7/1989 | Hahn |
| 4,855,671 A | 8/1989 | Fernandes |
| 4,874,904 A | 10/1989 | DeSanti |
| 4,885,655 A | 12/1989 | Springer et al. |
| 4,887,018 A | 12/1989 | Libert |
| 4,890,318 A | 12/1989 | Crane et al. |
| 4,926,105 A | 5/1990 | Mischenko et al. |
| 4,939,451 A | 7/1990 | Baran et al. |
| 4,944,187 A | 7/1990 | Frick et al. |
| 4,956,588 A | 9/1990 | Ming |
| 4,970,476 A | 11/1990 | Kitagawa |
| 4,972,167 A | 11/1990 | Fujioka |
| 4,991,050 A | 2/1991 | Heberlein, Jr. et al. |
| 4,992,709 A | 2/1991 | Griffin |
| 4,999,575 A | 3/1991 | Germer |
| 5,003,278 A | 3/1991 | May |
| 5,006,846 A | 4/1991 | Granville |
| 5,014,908 A | 5/1991 | Cox |
| 5,039,970 A | 8/1991 | Cox |
| 5,051,601 A | 9/1991 | Atobe et al. |
| 5,066,904 A | 11/1991 | Bullock |
| 5,079,510 A | 1/1992 | Komatsu et al. |
| D323,815 S | 2/1992 | Boutellier |
| 5,099,193 A | 3/1992 | Moseley et al. |
| 5,122,735 A | 6/1992 | Porter et al. |
| 5,148,348 A | 9/1992 | White |
| 5,181,026 A | 1/1993 | Granville |
| 5,196,784 A * | 3/1993 | Estes, Jr. .......... G01R 15/183 307/400 |
| D335,488 S | 5/1993 | Suzuki et al. |
| 5,223,790 A | 6/1993 | Baran et al. |
| 5,249,231 A | 9/1993 | Covey et al. |
| 5,267,122 A | 11/1993 | Glover et al. |
| 5,296,819 A | 3/1994 | Kuroiwa et al. |
| 5,311,138 A | 5/1994 | Ott et al. |
| 5,317,274 A | 5/1994 | Nakagawa et al. |
| 5,323,256 A | 6/1994 | Banks |
| 5,337,206 A | 8/1994 | Kadah et al. |
| 5,359,273 A | 10/1994 | Fluckiger |
| 5,365,462 A | 11/1994 | McBean |
| 5,377,128 A | 12/1994 | McBean |
| D354,945 S | 1/1995 | Dellavecchia et al. |
| 5,385,060 A | 1/1995 | Wang |
| 5,391,983 A | 2/1995 | Lusignan et al. |
| 5,397,970 A | 3/1995 | Rowlette et al. |
| 5,410,920 A | 5/1995 | Westwick |
| 5,426,360 A | 6/1995 | Maraio et al. |
| 5,430,438 A | 7/1995 | Joos et al. |
| 5,444,183 A | 8/1995 | Gehrs et al. |
| 5,450,765 A | 9/1995 | Stover |
| 5,467,012 A | 11/1995 | Nystrom |
| 5,471,359 A | 11/1995 | Simpson et al. |
| 5,473,234 A | 12/1995 | Richardson |
| 5,502,374 A | 3/1996 | Cota |
| 5,548,209 A | 8/1996 | Lusignan et al. |
| 5,563,506 A | 10/1996 | Fielden et al. |
| 5,572,073 A | 11/1996 | Burgess et al. |
| 5,578,927 A * | 11/1996 | Perelle .......... G08C 15/12 324/426 |
| 5,579,214 A * | 11/1996 | Kitani .......... H02M 7/217 363/127 |
| 5,592,989 A | 1/1997 | Lynn et al. |
| 5,596,652 A | 1/1997 | Piatek et al. |
| 5,604,315 A | 2/1997 | Briefer et al. |
| 5,612,499 A | 3/1997 | Andrew et al. |
| 5,677,476 A | 10/1997 | McCarthy et al. |
| 5,705,989 A | 1/1998 | Cota et al. |
| 5,712,558 A | 1/1998 | Saint-Cyr et al. |
| 5,753,983 A | 5/1998 | Dickie et al. |
| 5,784,249 A | 7/1998 | Pouliot |
| 5,808,846 A | 9/1998 | Holce et al. |

(56) References Cited

U.S. PATENT DOCUMENTS

| | | | |
|---|---|---|---|
| 5,844,138 A | 12/1998 | Cota | |
| 5,861,683 A | 1/1999 | Engel et al. | |
| 5,880,677 A | 3/1999 | Lestician | |
| 5,880,918 A | 3/1999 | Horbelt et al. | |
| 5,905,439 A | 5/1999 | McIntyre | |
| 5,909,087 A | 6/1999 | Bryde et al. | |
| 5,920,190 A | 7/1999 | Peterson et al. | |
| 5,920,191 A | 7/1999 | Maniero et al. | |
| 5,922,939 A | 7/1999 | Cota | |
| 5,994,892 A | 11/1999 | Turino et al. | |
| 5,995,911 A | 11/1999 | Hart | |
| 6,005,760 A | 12/1999 | Holce et al. | |
| D419,964 S | 2/2000 | Holce et al. | |
| 6,020,702 A | 2/2000 | Farr | |
| 6,029,524 A | 2/2000 | Klauder et al. | |
| 6,031,399 A * | 2/2000 | Vu | G11C 27/026 327/96 |
| 6,044,430 A | 3/2000 | MacDonald | |
| 6,046,550 A | 4/2000 | Ference et al. | |
| 6,064,192 A | 5/2000 | Redmyer | |
| 6,091,023 A | 7/2000 | O'Donnell | |
| 6,122,972 A | 9/2000 | Crider | |
| 6,124,791 A | 9/2000 | Wolf | |
| D431,534 S | 10/2000 | Holce et al. | |
| 6,133,709 A | 10/2000 | Puchianu | |
| 6,133,723 A | 10/2000 | Feight | |
| 6,137,418 A | 10/2000 | Zuercher et al. | |
| 6,146,109 A | 11/2000 | Davis et al. | |
| 6,219,216 B1 | 4/2001 | Holce et al. | |
| 6,236,949 B1 | 5/2001 | Hart | |
| 6,269,317 B1 | 7/2001 | Schachner et al. | |
| 6,308,140 B1 | 10/2001 | Dowling et al. | |
| 6,330,516 B1 * | 12/2001 | Kammeter | 702/60 |
| 6,331,821 B1 | 12/2001 | Holce et al. | |
| 6,344,951 B1 | 2/2002 | Sato et al. | |
| 6,351,206 B1 | 2/2002 | Schweiger et al. | |
| 6,373,238 B2 | 4/2002 | Lewis et al. | |
| 6,377,430 B2 | 4/2002 | Holce et al. | |
| 6,380,696 B1 | 4/2002 | Sembhi et al. | |
| 6,384,946 B1 | 5/2002 | Pitsch et al. | |
| 6,404,166 B1 | 6/2002 | Puchianu | |
| 6,414,241 B1 | 7/2002 | O'Donnell | |
| D466,078 S | 11/2002 | Bowman | |
| 6,496,378 B2 | 12/2002 | Holce et al. | |
| 6,504,357 B1 | 1/2003 | Hemminger et al. | |
| 6,504,695 B1 | 1/2003 | Holce et al. | |
| 6,549,859 B1 | 4/2003 | Ward | |
| 6,591,482 B1 | 7/2003 | Fleege et al. | |
| D478,313 S | 8/2003 | Bowman | |
| 6,615,147 B1 | 9/2003 | Jonker et al. | |
| 6,636,028 B2 | 10/2003 | Lavoie et al. | |
| 6,657,424 B1 | 12/2003 | Voisine et al. | |
| 6,724,600 B2 | 4/2004 | Holce et al. | |
| 6,737,854 B2 | 5/2004 | Bruno et al. | |
| 6,756,776 B2 | 8/2004 | Perkinson et al. | |
| 6,774,803 B1 | 8/2004 | Tiffin | |
| 6,809,509 B2 | 10/2004 | Bruno et al. | |
| 6,815,942 B2 | 11/2004 | Randall et al. | |
| 6,825,771 B2 | 11/2004 | Bruno et al. | |
| 6,856,515 B2 | 2/2005 | Holce et al. | |
| 6,861,683 B2 | 3/2005 | Rissing et al. | |
| 6,871,827 B2 | 3/2005 | Petak et al. | |
| 6,888,712 B2 | 5/2005 | Holce et al. | |
| 6,889,271 B1 | 5/2005 | Germer et al. | |
| 6,937,003 B2 | 8/2005 | Bowman et al. | |
| 6,950,292 B2 | 9/2005 | Holce et al. | |
| 6,988,043 B1 | 1/2006 | Randall | |
| 7,006,934 B2 | 2/2006 | Jonker et al. | |
| 7,053,497 B2 | 5/2006 | Sodemann et al. | |
| 7,147,261 B2 | 12/2006 | Ventura et al. | |
| 7,157,899 B2 | 1/2007 | Bruno | |
| 7,161,345 B2 | 1/2007 | Bruno | |
| 7,193,428 B1 | 3/2007 | Baron et al. | |
| 7,199,637 B2 * | 4/2007 | Koyama | H02M 7/217 327/330 |
| 7,212,930 B2 | 5/2007 | Bruno | |
| 7,221,145 B2 * | 5/2007 | Bowman et al. | 324/142 |
| 7,230,414 B2 | 6/2007 | Bruno | |
| 7,239,810 B2 | 7/2007 | Seely et al. | |
| 7,274,187 B2 | 9/2007 | Loy | |
| 7,282,889 B2 | 10/2007 | Freed et al. | |
| 7,310,049 B2 | 12/2007 | Bowman | |
| 7,312,686 B2 | 12/2007 | Bruno | |
| 7,313,668 B2 | 12/2007 | Worley | |
| 7,330,022 B2 | 2/2008 | Bowman et al. | |
| 7,333,345 B2 | 2/2008 | Holce et al. | |
| 7,352,287 B2 | 4/2008 | Rupert | |
| 7,359,809 B2 | 4/2008 | Bruno | |
| 7,362,232 B2 | 4/2008 | Holle et al. | |
| 7,447,603 B2 * | 11/2008 | Bruno | 702/64 |
| 7,474,088 B2 | 1/2009 | Bowman et al. | |
| 8,212,548 B2 | 7/2012 | Parker et al. | |
| 8,421,443 B2 * | 4/2013 | Bitsch et al. | 324/127 |
| 8,610,438 B1 * | 12/2013 | Sykora et al. | 324/522 |
| 2001/0010032 A1 * | 7/2001 | Ehlers et al. | 702/62 |
| 2002/0044018 A1 * | 4/2002 | Dupuis et al. | 330/254 |
| 2004/0075343 A1 * | 4/2004 | Wareham | H02J 3/14 307/39 |
| 2004/0183522 A1 | 9/2004 | Gunn et al. | |
| 2004/0227503 A1 | 11/2004 | Bowman et al. | |
| 2005/0190368 A1 * | 9/2005 | Ehrhardt et al. | 356/431 |
| 2005/0240362 A1 | 10/2005 | Randall | |
| 2006/0085144 A1 * | 4/2006 | Slota et al. | 702/57 |
| 2006/0103548 A1 | 5/2006 | Borkowski et al. | |
| 2006/0164096 A1 | 7/2006 | Kwon | |
| 2006/0181242 A1 | 8/2006 | Freed et al. | |
| 2006/0214089 A1 * | 9/2006 | An | 250/214.1 |
| 2009/0049222 A1 | 2/2009 | Lee et al. | |
| 2009/0115400 A1 | 5/2009 | Hunter | |
| 2009/0115620 A1 | 5/2009 | Hunter | |
| 2009/0295370 A1 * | 12/2009 | Parker et al. | 324/140 R |
| 2010/0235122 A1 * | 9/2010 | McCrea et al. | 702/64 |
| 2010/0308792 A1 * | 12/2010 | Rupert | G01R 21/133 324/76.77 |
| 2011/0156698 A1 | 6/2011 | Cook | |
| 2017/0184697 A1 * | 6/2017 | Kostrba | G01R 35/005 |
| 2017/0242059 A1 * | 8/2017 | Parker | G01R 21/133 |
| 2017/0254836 A1 * | 9/2017 | Cook | G01R 21/133 |

OTHER PUBLICATIONS

AT91M42800A Summary, "AT91 ARM Thumb Microcontrollers," Atmel, Feb. 2002.

Description of KT® 6300, 6400 Split-Core kW/kWH Transducers . . . Enercept KT®, 1 page by Hawkeye® (by Veris Industries, Inc.), at least one year prior to filing date (1997) (unavailable month).

Ganssie, "Interrupt Latency," Embedded.com, Article.. jhmtl?articleID=9900320, Aug. 26, 2004 <www.embedded.com/show>.

* cited by examiner

CURRENT METER WITH VOLTAGE AWARENESS

CROSS-REFERENCE TO RELATED APPLICATIONS

This application claims the benefit of Provisional App. No. 61/446,899, filed Feb. 25, 2011.

BACKGROUND OF THE INVENTION

The present invention relates a current monitoring system and, more particularly, to a branch circuit monitor configurable to enable current transformers with a plurality output voltage ranges to be used with the branch circuit monitor.

The total power consumption of a building or other facility is typically monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, etc. These single phase or multi-phase electrical loads are typically connected to one or more of the branch circuits that extend from the facility's power distribution panel. While a power meter may be installed at any location between a load and the distribution panel, typically a power meter capable of monitoring a plurality of circuits is installed proximate the power distribution panel to provide centralized monitoring of the various loads powered from the panel.

Flexibility has favored adoption of digital current and power meters, known as branch circuit monitors, incorporating data processing systems that can monitor a plurality of circuits and determine a number of parameters related to electricity consumption. A digital power meter for measuring electricity consumption by respective branch circuits comprises a plurality of voltage and current transducers that are periodically read by the meter's data processing unit which, in a typical digital power meter, comprises one or more microprocessors or digital signal processors (DSP). The data processing unit periodically reads and stores the outputs of the transducers sensing the magnitudes of the current and voltage and, using this sample data, calculates the current, voltage, power, and other electrical parameters, such as active power, apparent power and reactive power that quantify electricity distribution and consumption. The calculated parameters are typically output to a display for immediate viewing and/or transmitted from the meter's communications interface to another data processing system, such as a building management computer for remote display or further processing, for example formulating instructions to automated building equipment.

While the voltage transducer(s) of a digital power meter can be interconnected anywhere in the wiring that connects the supply and a load, including at the load's terminals, interconnection of voltage transducers and the facility's wiring is facilitated by wiring connections in the power distribution panel. The power distribution panel provides a convenient location for connecting the voltage transducers because typically each phase of the power is conducted by a separate bus bar in the power distribution panel and the voltage and phase is the same for all loads attached to the respective bus bar. The voltage transducers of digital power meters commonly comprise a voltage divider network that is connected to a conductor in which the voltage will be measured.

The current transducers of digital power meters typically comprise current transformers that encircle each of the power cables that interconnect each branch circuit to the bus bar(s) of the distribution panel. A current transformer typically comprises multiple turns of wire wrapped around the cross-section of a toroidal core. The power cable, conducting the load current, is passed through the aperture in the center of the toroidal core and constitutes the primary winding of the transformer and the wire wrapped around the cross-section of the core comprises the secondary winding of the transformer. Current flowing in the primary winding (primary current) induces a secondary voltage and current in the secondary winding which is quantitatively related to the current in the primary winding. The measurable output of a current transformer can be the current in the secondary winding or the voltage across a burden resistor connected in parallel with the secondary winding of the transformer. Output voltage ranges for current transformers are typically 0-0.333 volts (v.), 0-1 v., 0-5 v. or 0-10 v. However, current transformers with other output voltage ranges are available.

Typically, branch circuit monitors are designed for use with a particular current transformer having a single output voltage range. However, a user may desire to use a different transformer than the one specified for use with a particular meter. For example, when replacing a meter, there can be significant savings by using the current transformers for the previous meter. What is desired, therefore, is a branch circuit monitor providing flexible construction, simplified installation and improved serviceability.

DETAILED DESCRIPTION OF PREFERRED EMBODIMENTS

Figure 1:
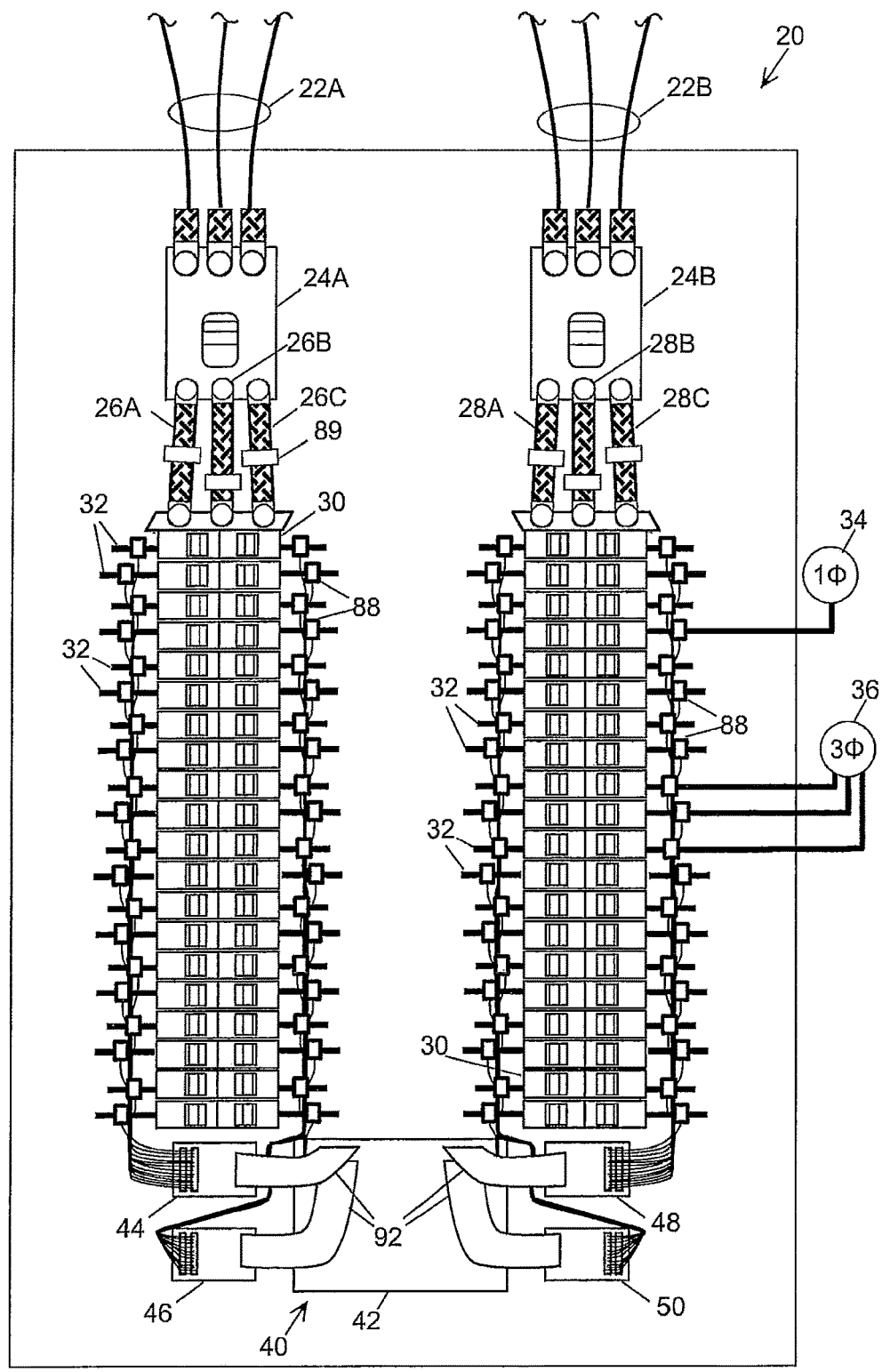
FIG. 1 is front view of an electric power distribution panel including a branch circuit monitor.

Electricity delivered by the local utility to a facility's mains is distributed to the various loads in the facility by branch circuits which are conductively connected to the mains at a distribution panel. Referring in detail to the drawings where similar parts are identified by like reference numerals, and, more particularly to FIG. 1, an exemplary distribution panel 20 includes two three-phase mains 22A, 22B which are respectively connected to main circuit breakers 24A, 24B. Each of the phases of each main is connected to a respective bus bar 26A, 26B, 26C and 28A, 28B, 28C. Three of the bus bars extend behind each of two rows of branch circuit breakers 30 that respectively conductively connect one of the bus bars to a branch circuit conductor 32 which is conductively connected to the load(s) of the branch circuit. A single phase load, for example, load 34, is conductively connected to single bus bar. A two-phase load is connected, typically, through two adjacent circuit breakers in the same row, to two bus bars conducting different phases of the power. A three-phase load, for example, load 36, is connected, typically, through three adjacent circuit breakers in the same row, to three bus bars each conducting a different phase of the electricity.

A digital branch circuit monitor 40 is often installed in an electrical distribution panel, such as the exemplary distribution panel 20, to monitor the current or the current and the voltage in the circuits served by the panel. For example, a digital branch circuit monitor produced by Veris Industries, Inc. can monitor the current or the power (current and voltage) in 84 branch circuit conductors and two three-phase mains of a power distribution panel and can determine, in addition to voltage and current, a number of other parameters related to energy consumption for each circuit served by the distribution panel. Data updates occur approximately every two seconds and an alarm may be triggered by the monitor if the operation of a circuit approaches a user configured threshold. The exemplary branch circuit monitor 40 comprises a main acquisition board 42 and four adapter boards 44, 46, 48, 50 facilitating interconnection of the measuring circuitry and the transducers which sense current and voltage in the various conductors of the distribution panel.

Figure 2:
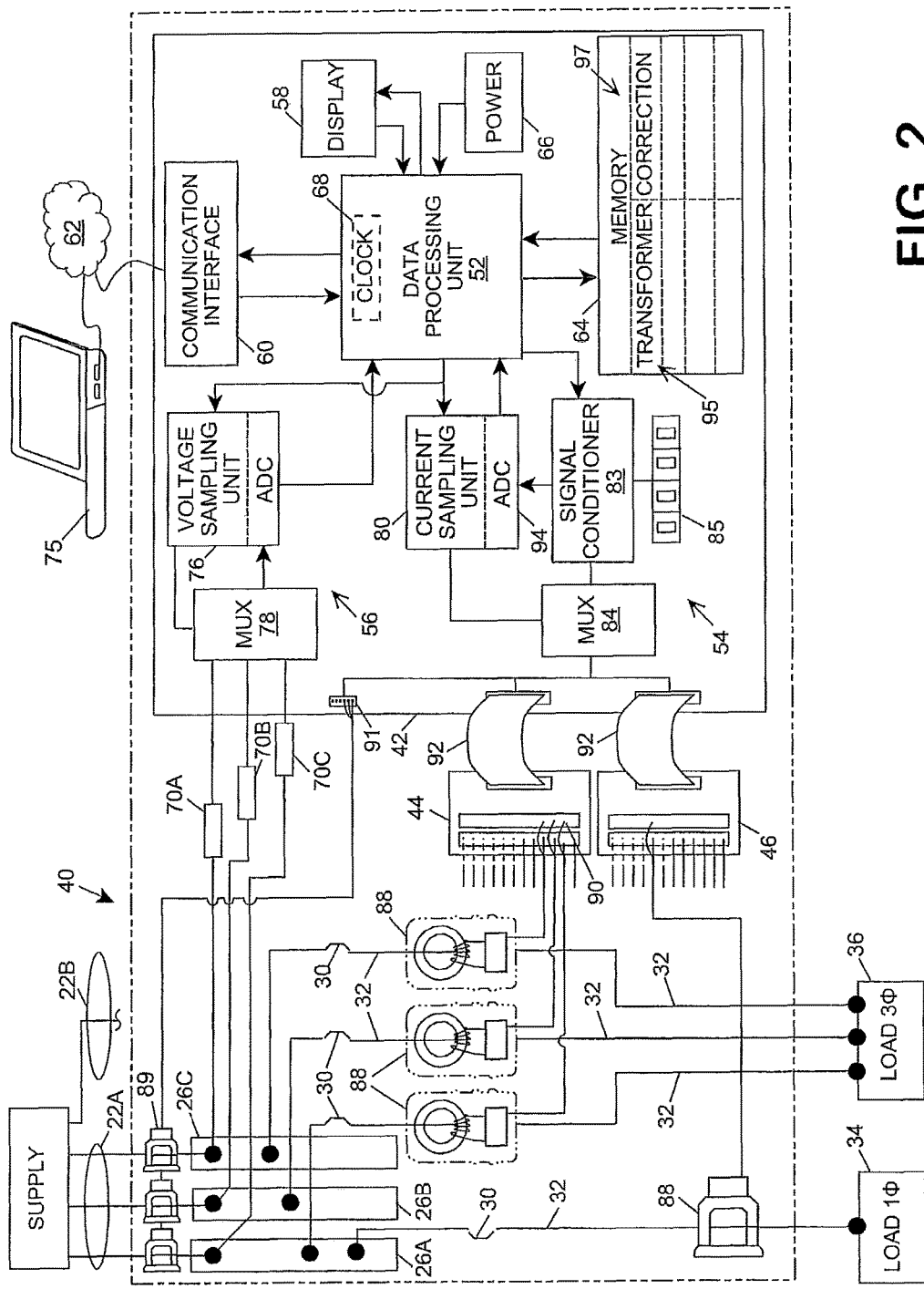
FIG. 2 is a schematic diagram of an exemplary branch circuit monitor.

Referring also to FIG. 2, the exemplary digital branch circuit monitor 40 is arranged to monitor both the voltage and the current in a plurality of branch circuits and comprises, generally, a data processing unit 52, a current measuring section 54 and a voltage measuring section 56. The data processing unit 52 typically comprises at least one microprocessor or digital signal processor (DSP). The data processing unit 52 periodically reads and stores sample data from the voltage 56 and the current 54 measuring sections, and uses that data to calculate the current, voltage, power and other electrical parameters that are the meter's output. The calculated values may be output to a display 58 for viewing at the meter or output to a communications interface 60 for transmission via a communication network 62 to another data processing system 75, such as a building management computer, for remote display or use in automating or managing the facility's operations. A memory 64 in which the software for the data processing unit and data manipulated by the data processing unit may be stored is associated with the data processing unit. A power supply 66 provides power to the data processing unit and to the voltage and current measuring sections. One or more clocks 68, which may be incorporated into the data processing unit, time intervals between the occurrences of monitored events.

The voltage measuring section 56 includes one or more voltage transducers 70A, 70B, 70C each typically comprising a resistor network, a voltage sampling unit 76 to sample the output of the voltage transducers and convert the analog measurements to digital data suitable for use by the data processing unit and a multiplexer 78 that periodically connects the voltage sampling unit to a selected one of the voltage transducers enabling periodic sampling of the magnitude of the voltage at each voltage transducer. Typically, each phase of the electricity supplied to a distribution panel is connected to a bus bar, for example, bus bars 26A, 26B, 26C. Each branch circuit breaker 30 conductively interconnects one of the bus bars to a branch circuit conductor 32 which is conductively connected to one of a plurality of the facility's loads, for examples, loads 34, 36. Since the voltage and phase supplied to all commonly connected loads is the same, a meter for measuring three-phase power typically includes three voltage transducers 70A, 70B, 70C each connected to one of the bus bars 26A, 26B, 26C that is conducting a different phase of the power from one of the mains, for example, main 22A.

The current measuring section 54 comprises a current sampling unit 80, a multiplexer 84, a signal conditioning unit 83 and a plurality of current transducers. The current transducers are preferably current transformers but other types of current sensors might be used. Current monitoring with a current transformer requires a current transformer for each of the conductors in which the current is to be monitored. In the exemplary branch circuit monitor 40, a current transformer 89 senses the current in each of the panel's mains and a branch circuit transformer 88 senses the current flowing in each of the branch conductors 32.

The auxiliary current transformers 89 monitoring the current in the mains are connected to a terminal block 91 on the main circuit board. Each terminal of the terminal block 91 is conductively connected to a multiplexer 84. For convenience, each of the branch current transducers 88 may be respectively connected to a sensor position 90 on one of the adapter boards, 44, 46, 48, 50. A multi-conductor cable 92 communicatively connects each of the sensor positions of each of the adapter boards to the multiplexer 84 on the main circuit board 42. The multiplexer 84 is connected to a signal conditioning unit 83 which is, in turn, conductively connected to an analog-to-digital converter 94 of the current sampling unit 80. In response to a timing signal from the clock 68, the multiplexer sequentially connects each sensor position and each terminal block connection to the signal conditioning unit 83 and thereby to the analog-to-digital converter 94 which outputs to the data processing unit 52 a digital signal representing a sample of the output of the selected current transducer. The data processing unit calculates the current in the conductor monitored by the selected current transformer from the characteristics of the transducer and a plurality of sample outputs of the transducer accumulated over a period of time.

Figure 3:
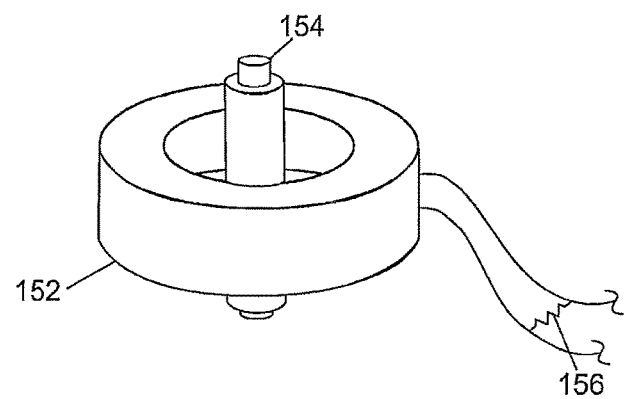
FIG. 3 is a perspective view of a solid core current transformer.
Figure 4:
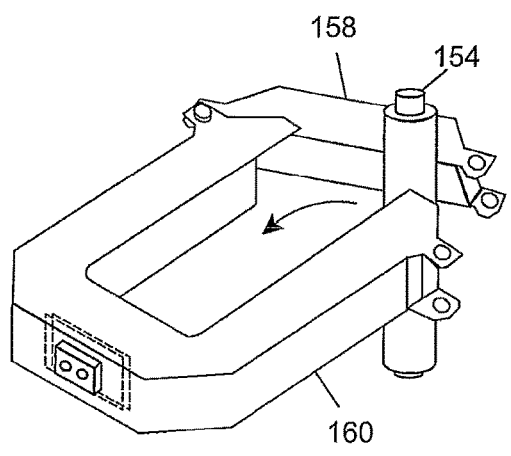
FIG. 4 is a perspective view of an open split core current transformer.
Figure 5:
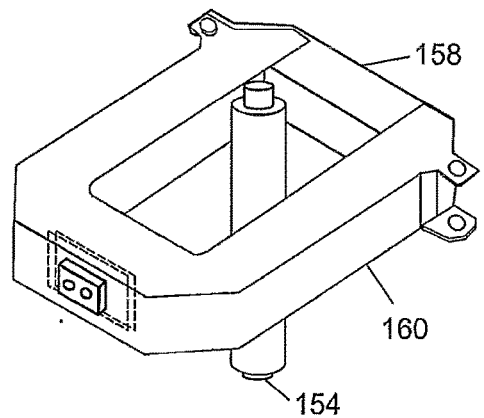
FIG. 5 is a perspective view of a closed split core current transformer.

Each current transformer comprises a coil of wire wound on the cross-section of a toroidal non-metallic or metallic core which is commonly enclosed in a plastic housing. Referring to FIGS. 3, 4, and 5, the conductor in which the current is to be measured, for example the conductor 154, is passed through the central aperture in the toroidal core. This conductor 154 is the primary winding of the transformer and current flowing in the conductor induces a secondary current and voltage in the wire wrapped around the cross-section of the core, the secondary winding. Referring to FIG. 3, current transformers may have a solid core 152 requiring that the conductor be disconnected for insertion into core's aperture. On the other hand referring to FIG. 4, current transformers may have a split core comprising two hinged or separable core portions 158, 160 enabling creation of a gap between the core portions for inserting the conductor 154 while it is still connected. Referring to FIG. 5, after the conductor 154 is positioned in the area of the core's central aperture, the core portions 158, 160 are joined, closing the gap, for operation.

Ideally, the secondary current of a current transformer is equal to the current in the primary winding, the conductor of the current that is to be measured, divided by turns ratio, the number of turns in the secondary winding divided by the number of turns in the primary winding which is often one. However, actual transformers are not ideal transformers and the magnetization of the core of a current transformer causes the primary current to be less than the product of the secondary current and the turns ratio. Accurate measurement of electric power requires compensation for error introduced by the transducers.

Figure 6:
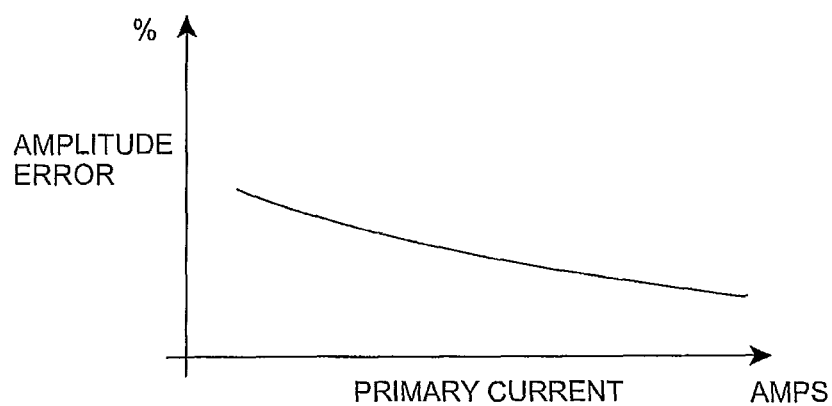
FIG. 6 is a graphical representation of a ratio error of a current transformer.

Current transformer error comprises a phase error and a ratio error. Referring to FIG. 6, the ratio error ($r_e$) varies with the magnitude of the primary current ($I_1$) as follows:

$$r_e(\%) = K_3 + K_4(\log I_1) \quad (1)$$

where $K_3$ and $K_4$ are constants.
The effect of the ratio error is to alter the relationship between the magnitudes of the measured secondary current ($I_2$) and the primary current ($I_1$) from the theoretical relationship, that is:

$$I_1 = I_2(n) \quad (2)$$

where n=turns ratio,
to the relationship:

$$I_1 = I_2'\left(n + \frac{nr_e}{100}\right) \quad (3)$$

where $I'_2$=measured secondary current
The magnitude of the measured secondary current ($I_2'$) is related to the theoretical secondary current ($I_2$), as follows:

$$I_2 = I_2'\left(1 + \frac{r_e}{100}\right) \quad (4)$$

Figure 7:
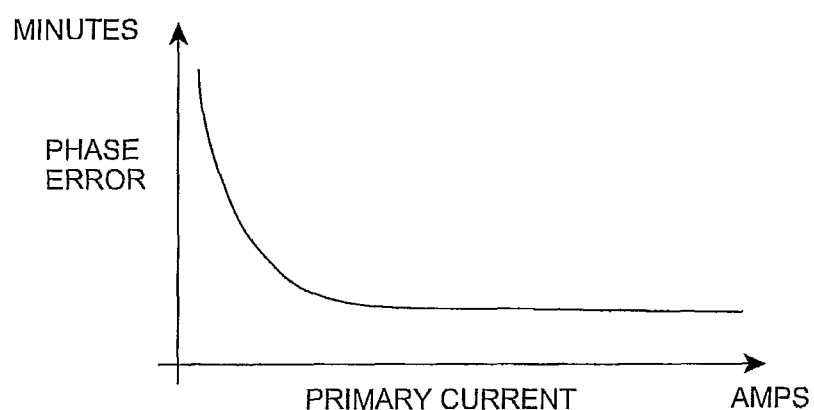
FIG. 7 is a graphical representation of a phase error of a current transformer.

Referring to FIG. 7, magnetization of the transformer core and windings also causes a phase shift between the current in the primary winding and the current in the secondary winding. The resulting phase error (P) varies with the magnitude of the primary current ($I_1$) approximately according to the relationship:

$$P = K_1 + K_2(I_1^{-M}) \quad (5)$$

where M, $K_1$ and $K_2$ are constants
In practice M is often approximately equal to ½ and, consequently, a square root approximation can often be conveniently employed as part of the overall correction algorithm.

The values of the constants $K_1$, $K_2$, $K_3$, and $K_4$ and, therefore, the magnitudes of the phase and ratio errors depend upon the configuration of the particular current transformer. Factors such as core material and turns ratio affect the values of the constants which are typically ascertained by experiment with samples of a given core configuration. Typically, the values of $K_1$, $K_2$, $K_3$, and $K_4$ are determined for a particular transformer configuration or production batch by comparing the actual performance of a sample of the transformer configuration to the performance of a standard device when the secondary winding is connected in parallel to a particular impedance or burden.

The sensed output of a current transformer may be the current in the secondary winding, typically, having a range of 4-20 milliamps (mA) or 0-5 Amps. On the other hand, the sensed output may be the voltage measured across a burden resistor 156 connected in parallel with the secondary winding. Manufacturers produce families of current transformers that respond to a plurality of different primary current ranges by producing a single full scale output voltage range. Typical output voltage ranges for current transformers are 0-0.333 v., 0-1 v., 0-5 v. or 0-10 v. However, current transformers with other output voltage ranges are available.

Typically, a branch circuit monitor is intended for operation with current transformers with a single specified output voltage range. However, a user may desire to use current transformers other than those recommended by the monitor's manufacturer to, for example, use existing current transformers when replacing a damaged or malfunctioning branch circuit monitor. The present inventor concluded that the flexibility and serviceability of a digital branch circuit monitor could be improved if the branch circuit monitor could accommodate current transformers with a plurality of output voltage ranges.

Figure 13:
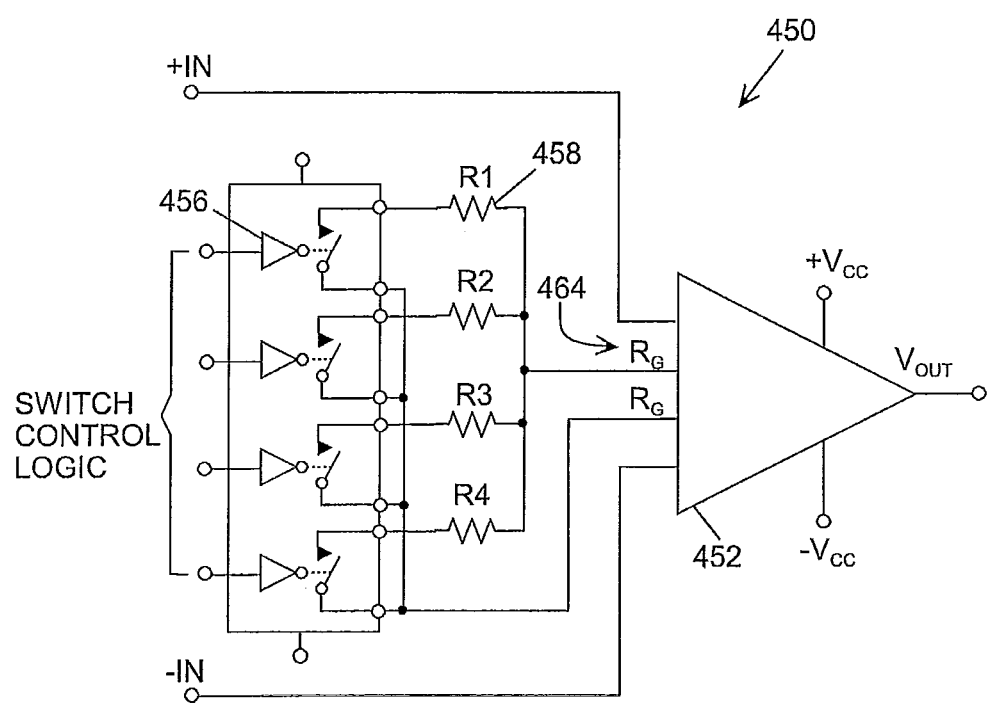
FIG. 13 is a schematic representation of a programmable gain instrumentation amplifier.

The exemplary branch circuit monitor 40 includes a signal conditioning unit 83 having an input connected to the multiplexer 84 and an output connected to the analog-to-digital converter 94. When the multiplexer 84 connects the input of the signal conditioning unit 83 to one of the current transformers 88, 89, the signal conditioning unit produces an output voltage which is quantitatively related to the voltage output by the current transformer which is, in turn, quantitatively related to the current in the conductor monitored by the respective transformer. The signal conditioning unit 83 is configurable to produce the full range of output voltages useable by the analog-to-digital converter 94 in response to current transformer output voltages within each of a plurality of voltage ranges. For example, the signal conditioning unit is configurable to produce the full range of output voltages in response to current transformer output voltages ranging from 0-0.333v, and to produce substantially the same range of output voltages in response to current transformer output voltages ranging from 0-1v. Referring to FIG. 13, while other devices might be used to produce a range of output voltages in response to various ranges of input voltage, preferably the signal conditioning unit 83 comprises a programmable gain instrumentation amplifier 450. The gain of the amplifier 452 is controlled by the value of the gain setting resistance ($R_G$) 454. The value of the gain setting resistance is controlled by selectively connecting one or more of a plurality of resistors 458 to the port of the amplifier 452 by actuating the appropriate switches 456. Actuation of the various switches 456 is controlled by switch control logic which might controlled manually, for example, by setting one or more DIP switches 85, or, preferably, by appropriate control signals from the data processing unit 52. By changing the value of $R_G$, the gain of the signal processing unit can be changed to output substantially the same range of output voltages for current transformers with different ranges of output voltage.

For convenience during installation, the branch circuit monitor 40 is configurable with branch circuit monitor configuration tool installed on the branch circuit monitor 40 or another computer 75. Typically, the remote computer 75 comprises a data processing unit to execute instructions; a memory for storing instructions and data utilized by the computer's data processing unit; one or more input devices, such as a keyboard and a mouse and/or touch pad; and a display and is communicatively connected, typically, either directly or via a communication network 62, such as the Internet, to the data processing unit 52 of the branch circuit monitor through the monitor's communication interface 60. When the configuration tool is activated, instructions executed by the data processing unit of the branch circuit monitor or the remote computer 75 cause a series of templates to be displayed on the monitor's display 58 and/or the display of the remote computer 75 enabling an installer of the branch circuit monitor to enter and store the branch circuit monitor's non-volatile memory 64 attributes of the current transformers which the user intends to use with the monitor.

Figure 8:
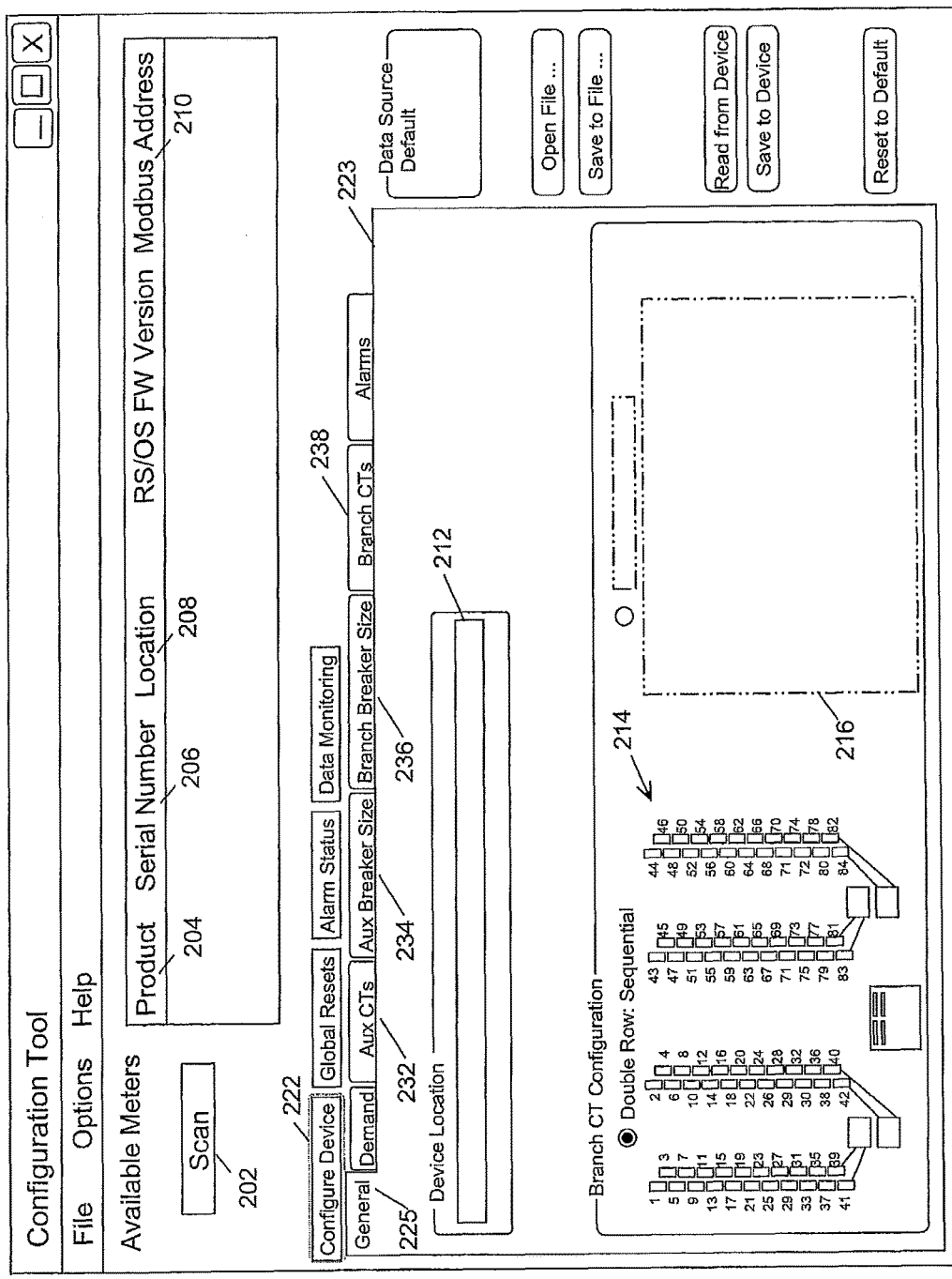
FIG. 8 is a pictorial representation of a main template for a branch circuit monitor configuration tool.

Referring to FIG. 8, an initial template 200 of the configuration tool comprises an interface enabling specification of general characteristics of the branch circuit monitor and its relationship to a larger data processing network, such as a building management system. The data processing unit 52 of the exemplary branch circuit monitor 40 can communicate with another data processing network utilizing the MODBUS® protocol. Each device in a network utilizing the MODBUS protocol must have a unique address. By selecting a scan button 202 on the template, the configuration tool can identify other devices making up a larger system by the device's product name 204, serial number 206, location 208 and MODBUS address 210. The initial template includes a plurality of user selectable buttons, including a configure device button 222, which, when selected, displays a tabbed file 223 to facilitate the specification of various attributes of the branch circuit monitor. When the general tab 225 of the initial template is selected, the installer can enter a general description of the branch circuit monitor that is being configured. Each distribution panel has a location identifier 212 which is used in reporting the operation of the branch circuit monitor and which can be entered from the template. The template also includes one or more icons 214, 216 representing possible arrangements for connecting the plurality of sets of branch current transformers that can supported by the monitor enabling the installer to easily select and specify the arrangement of the current transducers for a particular monitor.

Figure 9:
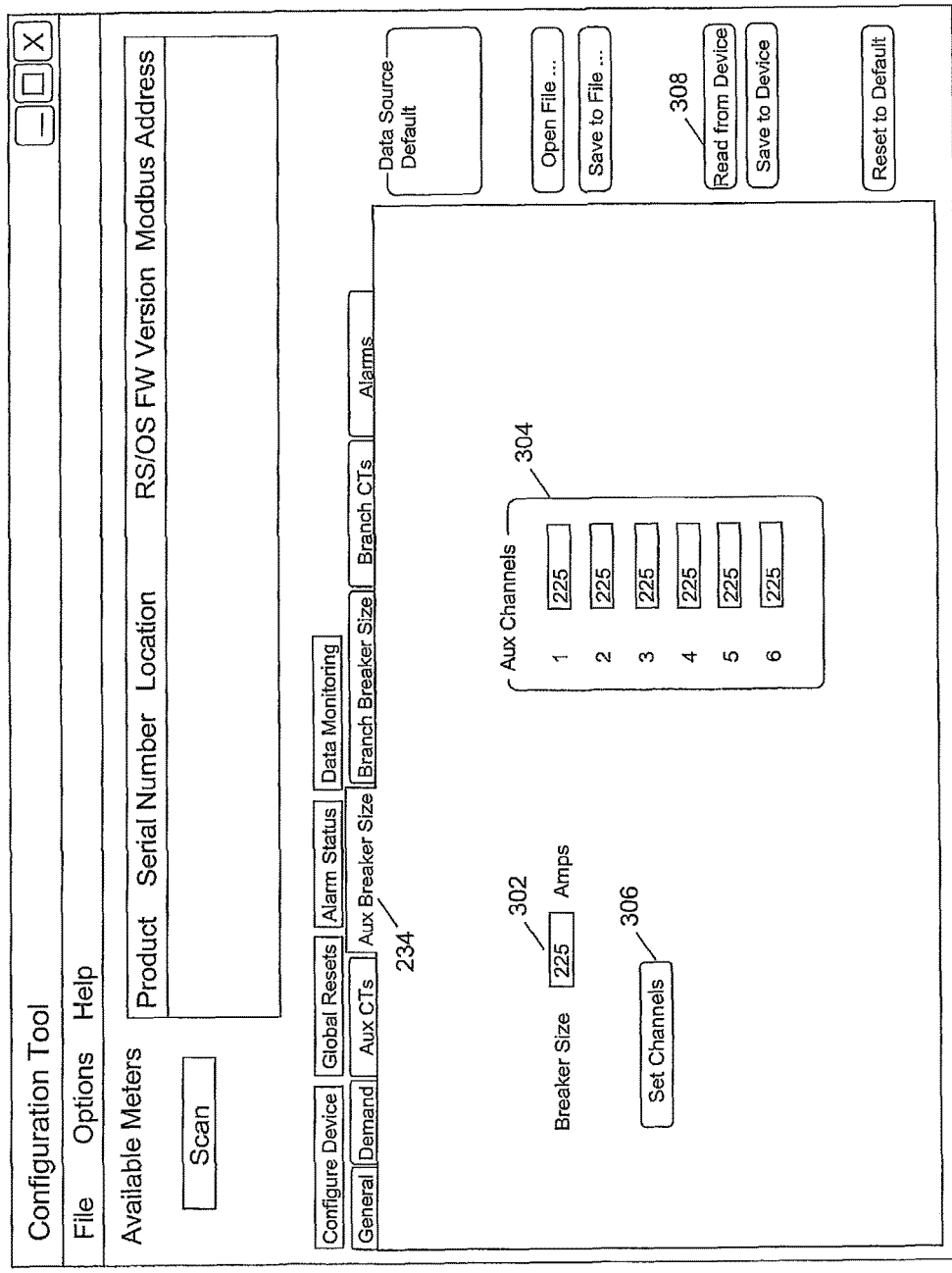
FIG. 9 is a pictorial representation of an auxiliary breaker specification template for a branch circuit monitor configuration tool.

Referring to also FIG. 9, selecting the AUX Breaker Size tab 234 on the initial display 200 displays a template 300 enabling specification of the size of a plurality of auxiliary circuit breakers, typically the mains circuit breakers. A typical mains circuit breaker is rated at 225 amps and the configuration tool suggests this size for the mains circuit breakers of the panel. If all the auxiliary circuit breakers have the same current rating the installer can enter the single rating 302 or if the auxiliary circuit breakers have different ratings, for example if one is not used, each auxiliary circuit breaker's rating can be specified separately 304. Clicking a SET CHANNELS button 306 saves the selected values. On the other hand, if the ratings of the auxiliary circuit breakers are already stored in the branch circuit monitor, selecting a button 308 in the template causes the monitor's data processing system to be queried and to load the ratings into the configuration tool.

Figure 10:
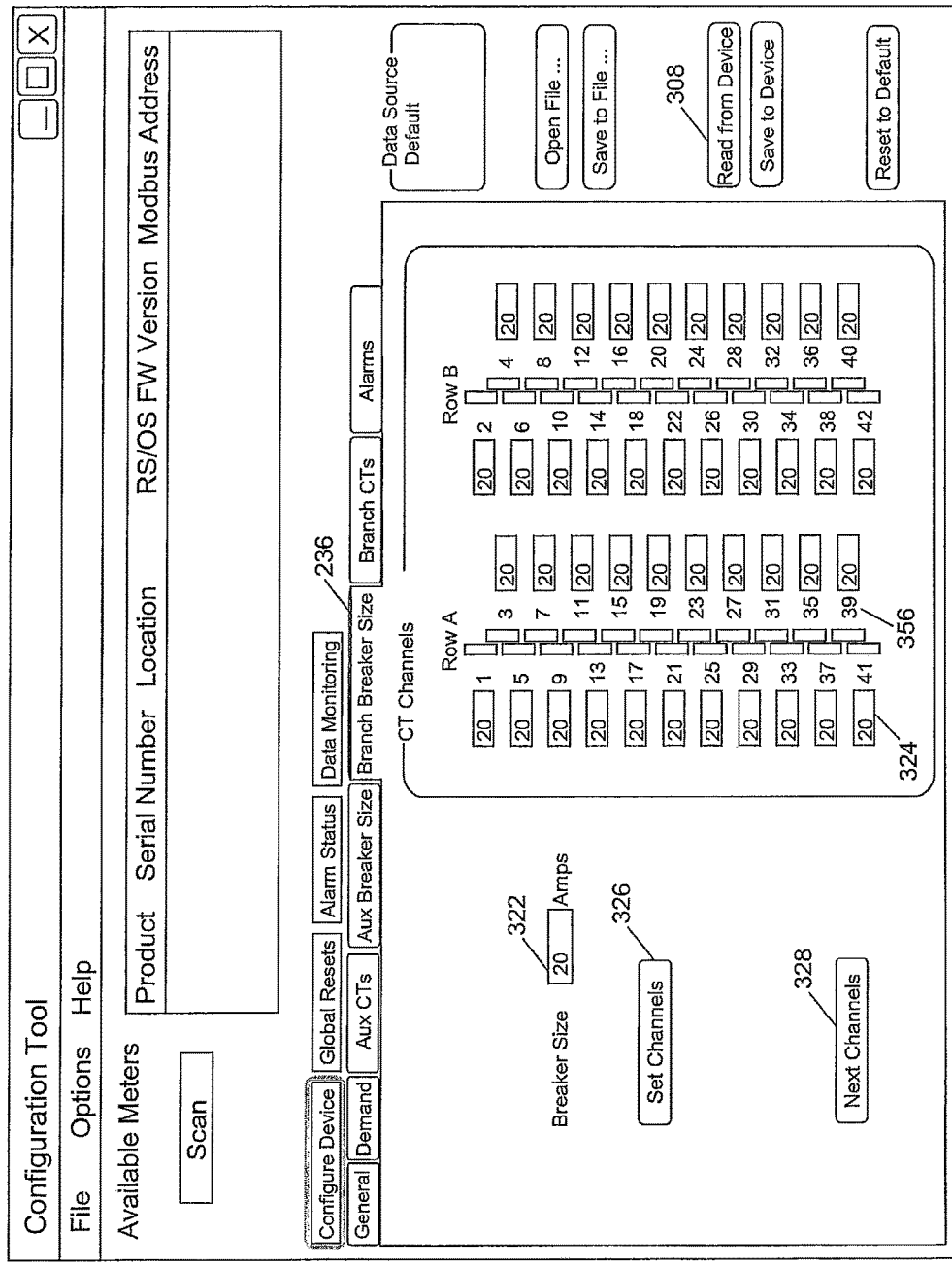
FIG. 10 is a pictorial representation of a branch breaker specification template for a branch circuit monitor configuration tool.

Referring to also FIG. 10, selecting the Branch Breaker Size tab 236 on the initial display 200 produces a template 320 enabling specification of the current ratings of the branch circuit breakers. If the branch circuit breakers have a common rating, the common rating can be entered 322 or, if various breakers have different ratings or are not used, the rating can be entered for specific circuit breaker 324. The template suggests a default value for the circuit breaker current rating that is common for branch circuit breakers. If the ratings of the branch circuit breakers are already stored in the branch circuit monitor's memory, the template enables querying the monitor's data processing system to upload the ratings to the configuration tool by selecting a button 308 on the template. When the size(s) of the branch circuit breakers have been specified, the sizes can be stored in the branch circuit monitor's memory by activating a SET CHANNELS button 326. If the monitor is monitoring additional branch circuits, activation of a NEXT CHANNELS button 328 will display the additional channels, for example, channels 43-82.

Figure 11:
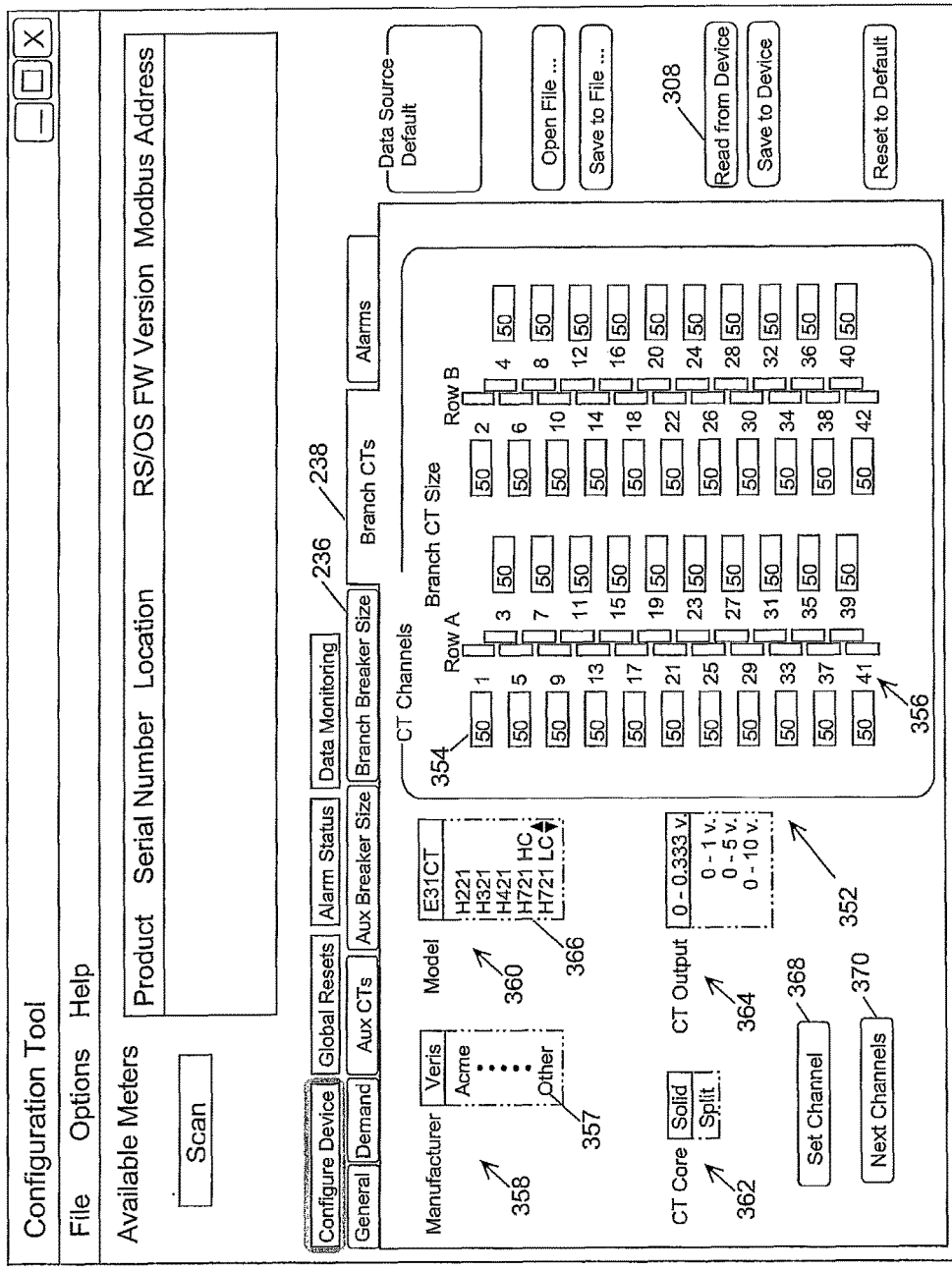
FIG. 11 is a pictorial representation of a branch current transformer specification template for a branch circuit monitor configuration tool.

Referring to also FIG. 11, selecting the branch current transformer (Branch CTs) tab 238 of the configuration tool produces a template 350 enabling the user to specify the branch current transformers to be used with the branch circuit monitor. The template includes a representation 352 of the arrangement of the current transformer channels of the branch circuit monitor. Initially, the template displays the current rating (size) 354, manufacturer 358, model 360, core type 362 and the output specification 364 for the recommended current transformer. However, the installer can select one or more current transformer channels 356 and change the specifications of the current transformer to be used with that channel or group of channels. When a channel is selected, pull-down menus, for example, pull-down menu 366, are enabled which display additional current transformer manufacturers, models, and core types stored in the monitor's memory for the size of current transformer specified for the selected channel. The template enables the user to selectively specify the current transformer to be used with each branch circuit that is to be monitored. Relevant specifications 95, including the output specification, and error correction factors 97 for correcting phase and ratio errors are stored in the meter for each of the current transformers displayable with the configuration tool. In addition, the configuration tool enables specifications and error factors from additional current transformers to be downloaded from a remote computer 75 for storage in the monitor's memory. Intermediate or typical error correction factors for OTHER current transformers 357 of various sizes may also be stored in the branch circuit monitor's memory for use with current transformers other than those having their particular specifications stored in the memory. When OTHER current transformers is selected, the installer can enter the transformer output specification appropriate for the transformers that will be used with the monitor. When the installer has specified the current transformer(s) to be used with the selected channel(s), a SET CHANNEL button 368 on the configuration tool template, causes the data processing unit to identify in the memory the appropriate specifications, including the appropriate error correction factors, to be used in calculating and displaying the current and other parameters related to the branch circuit(s) corresponding to the selected current transformer channel(s). The data processing unit 52 asserts the appropriate switch logic at the signal conditioning unit 83 to set the gain of the signal conditioning unit so that the signal conditioning unit produces the full range of output useable by the analog-to-digital converter for the specified range of transformer output. A NEXT CHANNELS button 370 displays additional current transformer channels that may be included in the monitor, for example, channels 43-82.

Figure 12:
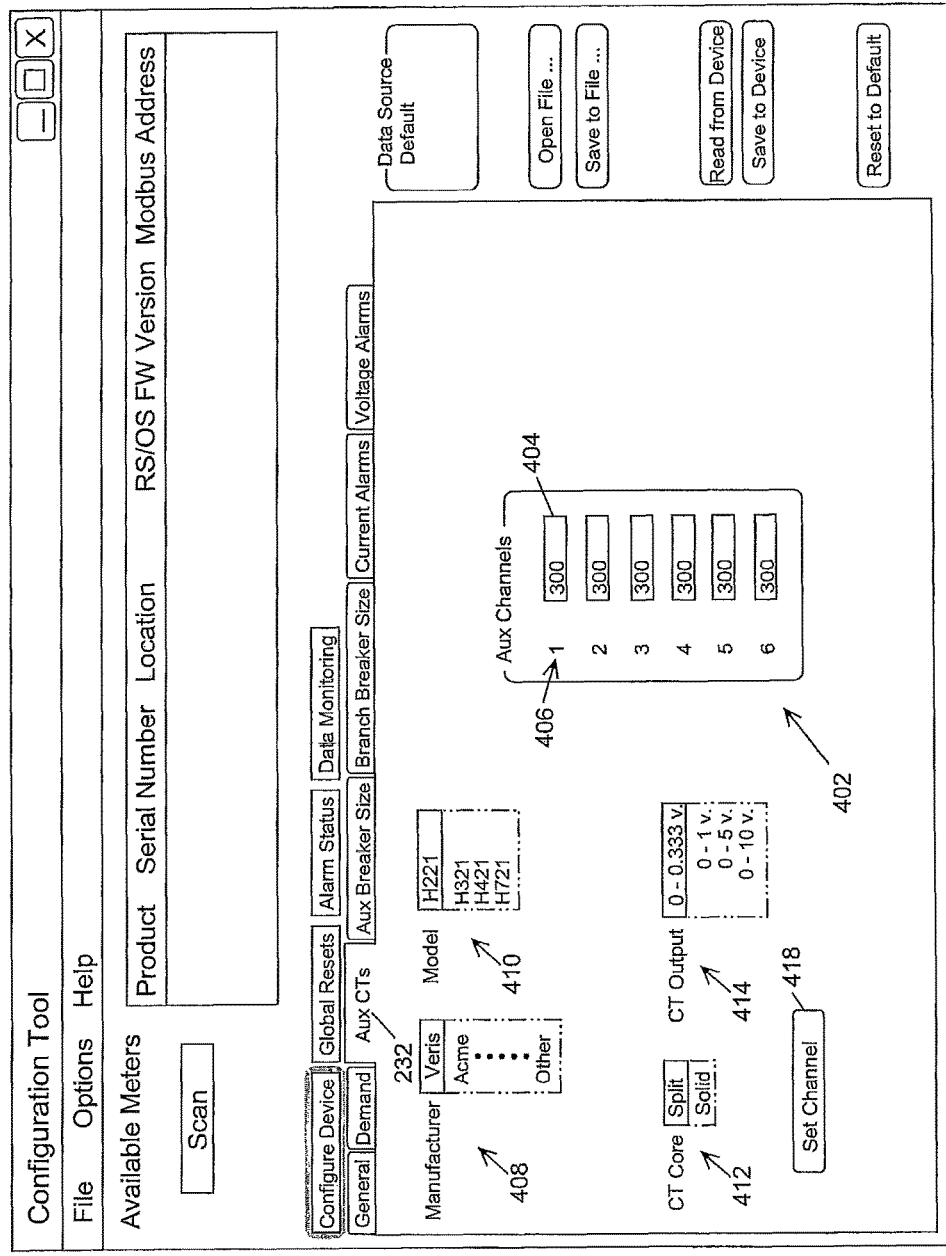
FIG. 12 is a pictorial representation of an auxiliary current transformer specification template for a branch circuit monitor configuration tool.

Referring to also FIG. 12, selecting the AUX CTs tab 232 produces a template 400 enabling the user to specify auxiliary current transformers used with the branch circuit monitor. Auxiliary current transformers are typically used to monitor the current in the mains. In a manner similar to the specification the branch current transformers, the installer can select individual auxiliary current transformer channels 406 and specify the size 404 of the auxiliary current transformer(s). The configuration tool causes the template to display the manufacturer 408, model 410, core type 412 and transformer output 414 for various current transformers of the desired size 404 which have specifications, including error correction factors, stored in the monitor's memory. When the installer has specified the auxiliary current transformer(s) that are used with the selected channel(s), activating the SET CHANNEL button 418 causes the data processing unit to identify the appropriate specifications and error correction factors stored in the memory 64 for use in determining the current sensed by the respective auxiliary current transformer. The data processing system exerts the appropriate switch logic at the signal conditioning unit 83 to produce the full range of output signals when transformer output in the specified range is input to the signal conditioning unit.

The user configurable signal conditioning unit enables current transformers with a variety of transformer output ranges to be used with the branch circuit monitor increasing the flexibility of the monitor.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

I claim:

1. A branch circuit monitor comprising
   (a) a signal conditioning unit including an amplifier producing an output voltage in response to an input voltage,
   (b) the signal conditioning unit selectable to produce a minimum output voltage in response to an input voltage of a minimum input voltage and to output a maximum output voltage in response to a first maximum input voltage,
   (c) the signal conditioning unit selectable to produce said minimum output voltage in response to an input voltage of said minimum input voltage and said maximum output voltage in response to a second maximum input voltage,
   (d) said maximum output voltage of (b) and said maximum output voltage of (c) is the same output voltage, said second maximum input voltage is different than said first maximum input voltage;
   (e) said signal conditioning unit providing a range of output voltages between said minimum output voltage and said maximum output voltage when selected in accordance with (b) and providing a range of output voltages between said minimum output voltage and said maximum output voltage when selected in accordance with (c).

2. The branch circuit monitor of claim 1 wherein said first maximum input voltage equals approximately one volt and said second maximum input voltage equals approximately three tenths of a volt.

3. The branch circuit monitor of claim 1 wherein said first maximum input voltage equals approximately one volt and said second maximum input voltage equals approximately five volts.

4. The branch circuit monitor of claim 1 wherein said first maximum input voltage equals approximately one volt and said second maximum input voltage equals approximately ten volts.

5. The branch circuit monitor of claim 1 wherein said signal conditioning unit comprises said amplifier having a variable gain.

6. The branch circuit monitor claim 5 wherein the gain of said amplifier is controlled by a resistance connected to said amplifier and said resistance is manually selected.

7. A branch circuit monitor comprising:
   (a) a current transformer including an amplifier producing a transformer voltage quantitatively related to a magnitude of a current in a primary winding of said current transformer, said transformer voltage ranging between a minimum transformer voltage and a maximum transformer voltage;
   (b) a signal conditioning unit producing an output voltage in response to said transformer voltage, said output voltage having a magnitude quantitatively related to a magnitude of said transformer voltage,
   (c) said signal conditioning unit selectable to produce a minimum output voltage in response to a minimum transformer voltage and a maximum output voltage in response to a first maximum transformer voltage,
   (d) said signal conditioning unit selectable to produce said minimum output voltage in response to said minimum transformer voltage and said maximum output voltage in response to a second maximum transformer voltage having a magnitude that is greater than a magnitude of said first maximum transformer voltage, said maximum output voltage of (c) and said maximum output voltage of (d) is the same output voltage;
   (e) said signal conditioning unit providing a range of output voltages between said minimum output voltage and said maximum output voltage when selected in accordance with (c) and providing a range of output voltages between said minimum output voltage and said maximum output voltage when selected in accordance with (d);
   (f) a data processing unit arranged to calculate a current in said primary winding of said current transformer from said output voltage of said signal conditioning unit.

8. The branch circuit monitor of claim 7 wherein said signal conditioning unit comprises said amplifier having a variable gain.

9. The branch circuit monitor claim 8 wherein the gain of said amplifier is controlled by a resistance connected to said amplifier and said resistance is manually selected.

* * * * *